(12) United States Patent
Cho et al.

(10) Patent No.: US 8,703,367 B2
(45) Date of Patent: Apr. 22, 2014

(54) POSITIVE PHOTOSENSITIVE RESIN COMPOSITION

(75) Inventors: Hyun-Yong Cho, Uiwang-si (KR); Doo-Young Jung, Uiwang-si (KR); Yong-Sik Yoo, Uiwang-si (KR); Ji-Young Jeong, Uiwang-si (KR); Jong-Hwa Lee, Uiwang-si (KR); Min-Kook Chung, Uiwang-si (KR); Kil-Sung Lee, Uiwang-si (KR); Myoung-Hwan Cha, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/073,005

(22) Filed: Mar. 28, 2011

(65) Prior Publication Data

US 2011/0171578 A1    Jul. 14, 2011

Related U.S. Application Data

(63) Continuation-in-part of application No. PCT/KR2008/007903, filed on Dec. 31, 2008.

(30) Foreign Application Priority Data

Sep. 29, 2008 (KR) .................. 10-2008-0095569

(51) Int. Cl.
*G03F 7/023* (2006.01)
*G03F 7/022* (2006.01)

(52) U.S. Cl.
CPC ........... *G03F 7/0226* (2013.01); *Y10S 430/107* (2013.01)
USPC ............. 430/18; 430/191; 430/192; 430/193; 430/906

(58) Field of Classification Search
CPC ..................... G03F 7/0233; G03F 7/0226
USPC ............. 430/18, 191, 192, 193, 906
See application file for complete search history.

(56) References Cited

U.S. PATENT DOCUMENTS

| | | |
|---|---|---|
| 2,772,975 A | 12/1956 | Rickers |
| 2,797,213 A | 6/1957 | Moore |
| 3,669,658 A | 6/1972 | Yonezawa et al. |
| 5,106,899 A | 4/1992 | Maresca |
| 5,114,826 A | 5/1992 | Kwong et al. |
| 5,376,499 A | 12/1994 | Hammerschmidt et al. |
| 5,449,584 A | 9/1995 | Banba et al. |
| 5,486,447 A | 1/1996 | Hammerschmidt et al. |
| 5,858,584 A | 1/1999 | Okabe et al. |
| 6,001,517 A | 12/1999 | Kawamonzen |
| 6,207,356 B1 | 3/2001 | Banba et al. |
| 6,232,032 B1 | 5/2001 | Nunomura et al. |
| 6,376,151 B1 | 4/2002 | Takahashi et al. |
| 6,808,862 B2 | 10/2004 | Kodama |
| 6,929,890 B2 | 8/2005 | Miyoshi et al. |
| 7,056,641 B2 | 6/2006 | Naiini et al. |
| 7,371,506 B2 | 5/2008 | Fujii et al. |
| 7,416,830 B2 | 8/2008 | Naiini et al. |
| 7,687,208 B2 | 3/2010 | Shibui |
| 8,080,350 B2 | 12/2011 | Banba et al. |
| 8,198,002 B2 | 6/2012 | Jung et al. |
| 2002/0090564 A1 | 7/2002 | Suwa et al. |
| 2004/0142275 A1 | 7/2004 | Komatsu |
| 2004/0229167 A1 | 11/2004 | Naiini et al. |
| 2005/0202337 A1 | 9/2005 | Miyoshi et al. |
| 2011/0159428 A1 | 6/2011 | Lee et al. |
| 2011/0171578 A1 | 7/2011 | Cho et al. |
| 2011/0294066 A1 | 12/2011 | Hasegawa |

FOREIGN PATENT DOCUMENTS

| | | |
|---|---|---|
| CN | 1356356 | 7/2002 |
| CN | 1831648 A | 9/2006 |
| EP | 0424940 A2 | 5/1991 |
| EP | 0491188 A2 | 6/1992 |
| JP | 63-096162 A | 4/1988 |
| JP | 03-209478 A | 9/1991 |
| JP | 04-031860 A | 2/1992 |
| JP | 11-044948 A | 2/1992 |
| JP | 11-65107 A | 3/1993 |
| JP | 07-281441 | 10/1995 |
| JP | 08-022118 A | 1/1996 |
| JP | 09-302221 | 11/1997 |
| JP | 10-307393 | 11/1998 |
| JP | 2000-199958 A | 7/2000 |
| JP | 2000-292913 | 10/2000 |
| JP | 2000-292913 A | 10/2000 |
| JP | 2004-170611 | 6/2004 |
| JP | 2004-334089 | 11/2004 |
| JP | 2005-043883 A | 2/2005 |
| JP | 2006-349700 A | 12/2006 |
| JP | 2007-304125 | 11/2007 |
| JP | 4105919 B2 | 6/2008 |

(Continued)

OTHER PUBLICATIONS

International Search Report and Written Opinion in counterpart International Application No. PCT/KR2008/007903 dated Aug. 10, 2009, pp. 1-6.

CRC Handbook of Chemistry and Physics; Haynes et al.; 9th ed. 2013, pp. 1-2.

Gore et al., "Molecular Polarisability, The Conformations of Diphenyl Ketone, Dimesityl Ketone, and Mesityl Phenyl Ketone as Solutes", J. Chem. Soc. (B), 1967, pp. 741-742.

Taiwanese Search Report in commonly owned Taiwanese Application No. 99144461 dated Mar. 28, 2013, pp. 1.

(Continued)

*Primary Examiner* — John Chu
(74) *Attorney, Agent, or Firm* — Additon, Higgins, Pendleton & Ashe, P.A.

(57) ABSTRACT

A positive photosensitive resin composition includes: (A) a polybenzoxazole precursor; (B) a photosensitive diazoquinone compound; (C) a silane compound; (D) a polyamic acid ester compound; and (E) a solvent. The positive photosensitive resin composition can reduce film shrinkage, can have high sensitivity, high resolution, and excellent residue removal properties, and can provide good pattern shapes.

8 Claims, No Drawings

(56) References Cited

FOREIGN PATENT DOCUMENTS

| | | |
|---|---|---|
| KR | 10-0183990 | 4/1999 |
| KR | 10-2001-0088824 A | 9/2001 |
| KR | 10-2006-0023520 A | 3/2006 |
| KR | 10-2007-0007026 A | 1/2007 |
| KR | 10-2008-0072083 A | 8/2008 |
| KR | 10-2009-0019731 A | 2/2009 |
| KR | 10-2009-0051028 A | 5/2009 |
| KR | 10-2009-0056737 A | 6/2009 |
| KR | 10-2011-0076492 A | 7/2011 |
| TW | 200504464 A | 2/2005 |
| TW | 200712778 | 4/2007 |
| TW | 201015224 | 4/2010 |
| TW | 201035242 | 10/2010 |
| WO | 2004/109400 A2 | 12/2004 |
| WO | 2008-020573 A1 | 2/2008 |
| WO | 2010/035925 A1 | 4/2010 |

OTHER PUBLICATIONS

Office Action in commonly owned U.S. Appl. No. 12/964,010 mailed Mar. 28, 2012, pp. 1-8.

Final Office Action in commonly owned U.S. Appl. No. 12/964,010 mailed Nov. 20, 2012, pp. 1-13.

Advisory Action in commonly owned U.S. Appl. No. 12/964,010 mailed Feb. 13, 2013, pp. 1-6.

Search Report in commonly owned Taiwanese Application No. 100141829 dated Oct. 10, 2013, pp. 1-2.

N-methylpyrrolidone, Solvent properties, (http://macro.Isu.edu/HowTo/solvents/N-Methylpyrrolidone.htm) pp. 1, (2012).

POSITIVE PHOTOSENSITIVE RESIN COMPOSITION

CROSS-REFERENCE TO RELATED APPLICATIONS

This application is a continuation-in-part of International Application No. PCT/KR2008/007903, filed Dec. 31, 2008, pending, which designates the U.S., published as WO 2010/035925, and is incorporated herein by reference in its entirety, and claims priority therefrom under 35 USC Section 120. This application also claims priority under 35 USC Section 119 from Korean Patent Application No. 10-2008-0095569, filed Sep. 29, 2008, in the Korean Intellectual Property Office, the entire disclosure of which is also incorporated herein by reference.

FIELD OF THE INVENTION

The present invention relates to a positive photosensitive resin composition.

BACKGROUND OF THE INVENTION

Conventional surface protective layers and interlayer insulating layers for semiconductor devices can include a polyimide resin, which can have excellent heat resistance, electrical characteristics, and mechanical characteristics, among other properties.

Polyimide resins have recently been used in the form of a photosensitive polyimide precursor composition. The polyimide precursor composition can be coated on a semiconductor device, patterned by ultraviolet (UV) rays, developed, and heat imidized to form a polyimide-based resin film, useful as a surface protective layer, an interlayer insulating layer, and the like. Accordingly, it is possible to significantly shorten the process for making a surface protective layer, an interlayer insulating layer, and the like, as compared to processes using conventional non-photosensitive polyimide precursor compositions.

The photosensitive polyimide precursor composition can be applied as a positive type, in which an exposed part is dissolved by development, or as a negative type, in which the exposed part is cured and maintained. Positive type photosensitive compositions can be advantageous because they can be developed by a non-toxic alkali aqueous solution.

A positive photosensitive polyimide precursor composition can include a polyimide precursor of polyamic acid, a photosensitive material of diazonaphthoquinone, and the like. However, the positive photosensitive polyimide precursor composition may not provide a desired pattern because the carbonic acid of the polyamidic acid used can be too highly soluble in an alkali.

In order to solve this problem, Japanese Patent Laid-Open Publication No. H10-30739 is directed to a material including a phenolic hydroxyl acid instead of carbonic acid, which is introduced by esterification of a polyamidic acid with an alcohol compound having at least one hydroxyl group. This material, however, may be insufficiently developed, which can cause problems such as reduced layer thickness or resin delamination from the substrate.

Japanese Patent Laid-open Publication No. S63-96162 is directed to a material prepared by mixing a polybenzoxazole precursor with a diazonaphthoquinone compound. When the polybenzoxazole precursor composition is actually used, however, layer thickness of an unexposed part can be significantly decreased, so that it can be difficult to obtain a desirable pattern after the developing process.

The molecular weight of the polybenzoxazole precursor can be increased to reduce loss of layer thickness of the unexposed part. This can, however, generate development residue (scum), which can deteriorate resolution and lengthen development times of the exposed part.

Japanese Patent Laid-Open Publication No. H9-302221 and Japanese Patent Laid-Open Publication No. 2000-292913 are directed to methods of suppressing loss of layer thickness adding a particular phenol compound to a polybenzoxazole precursor composition. These methods, however, may not sufficiently suppress loss of layer thickness of the unexposed part. Accordingly, there is still a need for a material and method which can prevent or minimize the generation of development residue and also can effectively suppress loss of layer thickness.

Also, phenol used to adjust the solubility can be decomposed or cause a side reaction at a high temperature during thermocuring, or can form micropores in a layer when it is evaporated at a high temperature, which can damage the mechanical properties of a cured film. Therefore, there is also a need for a dissolution controlling agent that can resolve these problems.

SUMMARY OF THE INVENTION

The present invention relates to a positive photosensitive resin composition that can have high sensitivity, high resolution, and excellent residue removal properties and can provide good pattern formation. The positive photosensitive resin composition can also maintain optimal solid content and viscosity with only a small amount of polybenzoxazole precursor and can provide low film shrinkage and excellent film characteristics.

The present invention further provides a semiconductor device including a photosensitive resin film fabricated by using the positive photosensitive resin composition.

The embodiments of the present invention are not limited to the above technical purposes, and a person of ordinary skill in the art can understand other technical purposes.

According to one embodiment of the present invention, a positive photosensitive resin composition is provided that includes (A) a polybenzoxazole precursor including a repeating unit represented by the following Formula 1, (B) a photosensitive diazoquinone compound, (C) a silane compound, (D) a polyamic acid ester compound, and (E) a solvent.

[Chemical Formula 1]

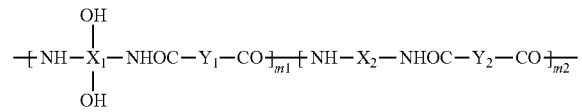

In the above Formula 1:

$X_1$ is an aromatic organic group, a tetravalent to hexavalent aliphatic organic group, an alicyclic organic group including a hetero atom, such as N, O, P, S, Si, or a combination thereof, or a tetravalent to hexavalent aliphatic organic group including a hetero atom, such as N, O, P, S, Si, or a combination thereof;

$X_2$ is an aromatic organic group, a divalent to hexavalent aliphatic organic group, an alicyclic organic group including a hetero atom, such as N, O, P, S, Si, or a combination thereof, a divalent to hexavalent aliphatic organic group including a hetero atom, such as N, O, P, S, Si, or a combination thereof, or a group represented by the following Formula 2;

$Y_1$ and $Y_2$ are the same or different and are independently an aromatic organic group, a divalent to hexavalent aliphatic organic group, an alicyclic organic group including a hetero atom, such as N, O, P, S, Si, or a combination thereof, or a divalent to hexavalent aliphatic organic group including a hetero atom, such as N, O, P, S, Si, or a combination thereof;

$m_1$ and $m_2$ are respectively mole ratios, where $m_1+m_2$ is 100 mol %;

$m_1$ ranges from 60 to 100 mol %; and $m_2$ ranges from 0 to 40 mol %.

[Chemical Formula 2]

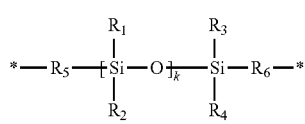

In the above Formula 2:

$R_1$ to $R_4$ are the same or different and are independently substituted or unsubstituted alkyl, substituted or unsubstituted aryl, substituted or unsubstituted alkoxy, or hydroxy;

$R_5$ and $R_8$ are the same or different and are independently substituted or unsubstituted alkylene or substituted or unsubstituted arylene; and k is an integer ranging from 1 to 50.

According to another embodiment of the present invention, a semiconductor device including a photosensitive resin film made using the positive photosensitive resin composition is provided.

Hereinafter, further embodiments of the present invention will be described in detail.

The positive photosensitive resin composition of the present invention can decrease the solid content of a polybenzoxazole precursor by using a polyamic acid ester compound as a dissolution controlling agent, and can provide high sensitivity, high resolution, an excellent residue removal property, an excellent pattern formation property, low film shrinkage, and excellent film characteristics.

DETAILED DESCRIPTION

The present invention now will be described more fully hereinafter in the following detailed description of the invention and with reference to the accompanying drawing, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

Exemplary embodiments of the present invention will hereinafter be described in detail. However, these embodiments are only exemplary, and the present invention is not limited thereto.

As used herein, when a specific definition is not otherwise provided, the terms "tetravalent to hexavalent organic group" and "divalent to hexavalent organic group" respectively refer to an organic group including a tetravalent to hexavalent functional group and an organic group including a divalent to hexavalent functional group. The functional group refers to a substituent excluding hydrogen.

As used herein, when a specific definition is not otherwise provided, the term "substituted" refers to one substituted with halogen, alkyl, aryl, alkoxy, amino, alkenyl, or a combination thereof, in place of at least one hydrogen.

As used herein, when a specific definition is not otherwise provided, the term "alkyl" refers to C1 to C30 alkyl, for example C1 to C15 alkyl, the term "alkoxy" refers to C1 to C30 alkoxy, for example C1 to C18 alkoxy, the term "aryl" refers to C6 to C30 aryl, for example C6 to C18 aryl, the term "alkenyl" refers to C2 to C30 alkenyl, for example C2 to C18 alkenyl, the term "alkylene" refers to C1 to C30 alkylene, for example C1 to C18 alkylene, and the term "arylene" refers to C6 to C30 arylene, for example C6 to C18 arylene.

As used herein, the term "aliphatic organic group" refers to C1 to C30 alkyl, C2 to C30 alkenyl, or C2 to C30 alkynyl, the term "alicyclic organic group" refers to C3 to C30 cycloalkyl, C3 to C30 cycloalkenyl, or C3 to C30 cycloalkynyl, and the term "aromatic organic group" refers to C6 to C30 aryl or C2 to C30 heteroaryl.

Also as used herein, when a specific definition is not otherwise provided, the term "hetero" refers to a group including 1 to 20, for example 1 to 15, and as another example 1 to 5, heteroatoms comprising N, O, S, P, Si, or a combination thereof.

The photosensitive resin composition according to one embodiment of the present invention includes (A) a polybenzoxazole precursor including a repeating unit represented by the following Formula 1, (B) a photosensitive diazoquinone compound, (C) a silane compound, (D) a polyamic acid ester compound, and (E) a solvent.

(A) Polybenzoxazole Precursor

The polybenzoxazole precursor includes a repeating unit represented by the following Formula 1.

[Chemical Formula 1]

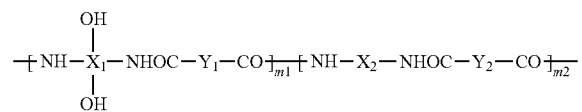

In the above Formula 1:

$X_1$ is an aromatic organic group, a tetravalent to hexavalent aliphatic organic group, an alicyclic organic group including a hetero atom, such as N, O, P, S, Si, or a combination thereof, or a tetravalent to hexavalent aliphatic organic group including a hetero atom, such as N, O, P, S, Si, or a combination thereof;

$X_2$ is an aromatic organic group, a divalent to hexavalent aliphatic organic group, an alicyclic organic group including a hetero atom, such as N, O, P, S, Si, or a combination thereof, a divalent to hexavalent aliphatic organic group including a hetero atom, such as N, O, P, S, Si, or a combination thereof, or a group represented by the following Formula 2;

$Y_1$ and $Y_2$ are the same or different and are independently an aromatic organic group, a divalent to hexavalent aliphatic organic group, an alicyclic organic group including a hetero atom, such as N, O, P, S, Si, or a combination thereof, or a divalent to hexavalent aliphatic organic group including a heteroatom, such as N, O, P, S, Si, or a combination thereof;

$m_1$ and $m_2$ are respectively mole ratios, wherein $m_1+m_2$ is 100 mol %;

$m_1$ ranges from 60 to 100 mol %; and $m_2$ ranges from 0 to 40 mol %.

[Chemical Formula 2]

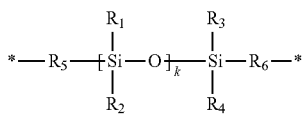

In the above Formula 2:

$R_1$ to $R_4$ are the same or different and are independently substituted or unsubstituted alkyl, substituted or unsubstituted aryl, substituted or unsubstituted alkoxy, or hydroxy;

$R_5$ and $R_6$ are the same or different and are independently substituted or unsubstituted alkylene or substituted or unsubstituted arylene; and k is an integer ranging from 1 to 50.

$X_1$ may be derived from an aromatic diamine compound such as but not limited to 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2'-bis(3-amino-4-hydroxy-5-trifluoromethylphenyl)hexafluoropropane, 2,2'-bis(3-amino-4-hydroxy-6-trifluoromethylphenyl)hexafluoropropane, 2,2'-bis(3-amino-4-hydroxy-2-trifluoromethylphenyl)hexafluoropropane, 2,2'-bis(4-amino-3-hydroxy-5-trifluoromethylphenyl)hexafluoropropane, 2,2'-bis(4-amino-3-hydroxy-6-trifluoromethylphenyl)hexafluoropropane, 2,2'-bis(4-amino-3-hydroxy-2-trifluoromethylphenyl)hexafluoropropane, 2,2'-bis(3-amino-4-hydroxy-5-pentafluoroethylphenyl)hexafluoropropane, 2-(3-amino-4-hydroxy-5-trifluoromethylphenyl)-2'-(3-amino-4-hydroxy-5-pentafluoroethylphenyl)hexafluoropropane, 2-(3-amino-4-hydroxy-5-trifluoromethylphenyl)-2'-(3-hydroxy-4-amino-5-trifluoromethylphenyl)hexafluoropropane, 2-(3-amino-4-hydroxy-5-trifluoromethylphenyl)-2'-(3-hydroxy-4-amino-6-trifluoromethylphenyl)hexafluoropropane, 2-(3-amino-4-hydroxy-5-trifluoromethylphenyl)-2'-(3-hydroxy-4-amino-2-trifluoromethylphenyl)hexafluoropropane, 2-(3-amino-4-hydroxy-2-trifluoromethylphenyl)-2'-(3-hydroxy-4-amino-5-trifluoromethylphenyl)hexafluoropropane, 2-(3-amino-4-hydroxy-6-trifluoromethylphenyl)-2'-(3-hydroxy-4-amino-5-trifluoromethylphenyl)hexafluoropropane, and the like, and combinations thereof.

In exemplary embodiments, $X_1$ can be represented by the following Formula 3 or 4.

[Chemical Formula 3]

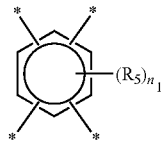

[Chemical Formula 4]

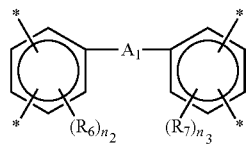

In the above Formulae 3 and 4:

$A_1$ is O, CO, $CR_8R_9$, $SO_2$, S, or a single bond;

$R_8$ and $R_9$ are the same or different and are independently hydrogen or substituted or unsubstituted, for example $R_8$ and $R_9$ can each be fluoroalkyl;

$R_5$ to $R_7$ are the same or different and are independently hydrogen, substituted or unsubstituted alkyl, hydroxy, carboxylic acid, or thiol;

$n_1$ is an integer ranging from 1 to 2; and $n_2$ and $n_3$ are the same or different and are independently integers ranging from 1 to 3.

$X_2$ may be derived from an aromatic diamine or a silicon diamine.

Examples of the aromatic diamine include without limitation aromatic amines such as 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylene diamine, p-phenylene diamine, 1,5-naphthalenediamine, 2,6-naphthalenediamine, and the like; aromatic amines such as the foregoing and including an aromatic ring substituted with an alkyl or a halogen; bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, and the like. These aromatic diamines can be used singularly or in combination.

Examples of the silicon diamine include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

The aromatic diamine and silicon diamine are not limited to the above described compounds.

The aromatic diamines and silicon diamines may also be used as a mixture thereof.

$Y_1$ and $Y_2$ may be derived from a dicarboxylic acid derivative.

Examples of the dicarboxylic acid derivative may include without limitation a carbonyl halide derivative or an active ester compound that is obtained by reacting dicarboxylic acid with 1-hydroxy-1,2,3-benzotriazole. Examples of the dicarboxylic acid derivative include without limitation diphenyloxy dicarboxylic acid chloride, bis(phenyl carboxylic acid chloride)sulfone, bis(phenyl carboxylic acid chloride)ether, bis(phenyl carboxylic acid chloride)phenone, phthalic carboxylic aciddichloride, terephthalic acid dichloride, isophthalic carboxylic acid dichloride, carboxylic acid dichloride, diphenyloxydicarboxylate benzotriazole, and the like, and combinations thereof.

$Y_1$ and $Y_2$ may be the same or different and may be independently selected from compounds of the following Formulae 5 to 7, but are not limited thereto.

[Chemical Formula 5]

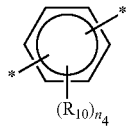

-continued

[Chemical Formula 6]

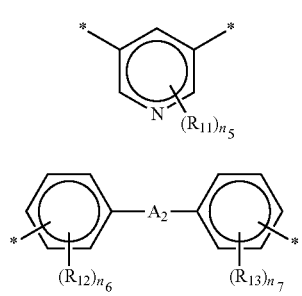

[Chemical Formula 7]

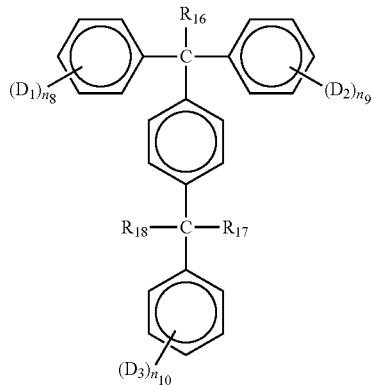

In the above Formulae 5 to 7:

$R_{10}$ to $R_{13}$ are the same or different and are independently hydrogen, substituted or unsubstituted alkyl, hydroxy, carboxylic acid, or thiol;

$n_4$, $n_6$, and $n_7$ are the same or different and are independently integers of 1 to 4;

$n_5$ is an integer of 1 to 3; and $A_2$ is O, $CR_{14}R_{15}$, CO, CONH, S, or $SO_2$, wherein $R_{14}$ and $R_{15}$ are the same or different and are independently substituted or unsubstituted alkyl, hydrogen, or fluoroalkyl.

The polybenzoxazole precursor can have a weight average molecular weight (Mw) of about 3000 to about 300,000. When the weight average molecular weight is less than about 3000, sufficient properties may not be obtained, whereas when the weight average molecular weight is more than about 300,000, solubility with respect to an organic solvent may be reduced and thus it can be difficult to handle it.

(B) Photosensitive Diazoquinone Compound

The photosensitive diazoquinone compound may be a compound including a 1,2-benzoquinone diazide or 1,2-naphthoquinone diazide structure. These compounds are described in U.S. Pat. Nos. 2,772,975, 2,797,213, and 3,669,658, the entire disclosure of each of which is incorporated herein by reference.

The photosensitive diazoquinone compound may include the compounds represented by the following Formulae 8 to 11, but is not limited thereto.

[Chemical Formula 8]

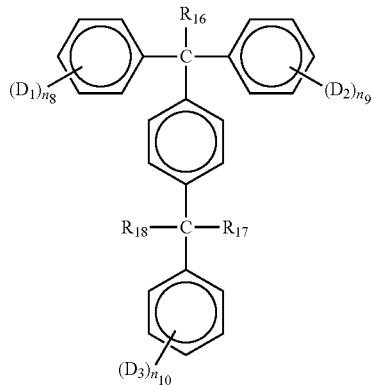

In the above Formula 8:

$R_{16}$ to $R_{18}$ are the same or different and are independently substituted or unsubstituted alkyl, such as $CH_3$;

$D_1$ to $D_3$ are independently OQ;

Q is may be hydrogen, or the following Formula 8-1 or 8-2, provided that all Q are not hydrogen; and $n_8$ to $n_{10}$ are the same or different and are independently integers ranging from 1 to 3.

[Chemical Formula 8-1]

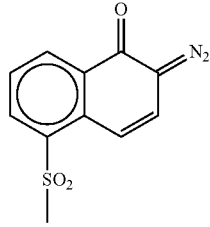

[Chemical Formula 8-2]

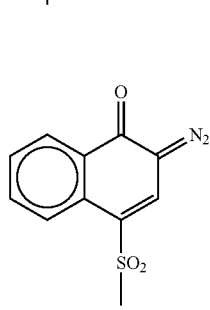

[Chemical Formula 9]

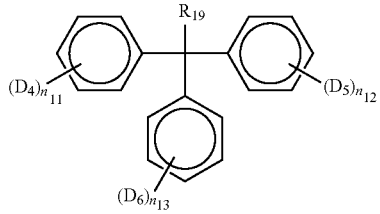

In the above Formula 9, $R_{19}$ is hydrogen or substituted or unsubstituted alkyl, $D_4$ to $D_6$ are OQ, where Q is the same as defined in Chemical Formula 8, and $n_{11}$ to $n_{13}$ are the same or different and are independently integers ranging from 1 to 3.

[Chemical Formula 10]

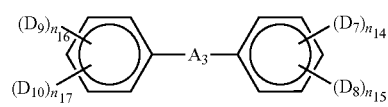

In the above Formula 10:

$A_3$ is CO or CRR', R and R' are the same or different and are independently substituted or unsubstituted alkyl;

$D_7$ to $D_{10}$ are the same or different and are independently hydrogen, substituted or unsubstituted alkyl, OQ, or NHQ;

Q is the same as defined in Chemical Formula 8;

$n_{14}$, $n_{15}$, $n_{16}$, and $n_{17}$ are the same or different and are independently integers ranging from 1 to 4; and $n_{14}+n_{15}$ and $n_{16}+n_{17}$ are independently integers of 5 or less, provided that at least one of $D_7$ to $D_8$ is OQ, and one aromatic ring includes one to three OQs and the other aromatic ring includes one to four OQs.

[Chemical Formula 11]

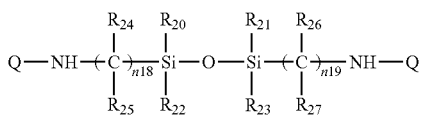

In the above Formula 11, $R_{20}$ to $R_{27}$ are the same or different and are independently hydrogen or substituted or unsubstituted alkyl, $n_{18}$ and $n_{19}$ are the same or different and are independently integers ranging from 1 to 5, for example 2 to 4, and Q is the same as defined in Chemical Formula 8.

The photosensitive resin composition includes about 5 to about 100 parts by weight of the photosensitive diazoquinone compound, based on about 100 parts by weight of the polybenzoxazole precursor. In some embodiments, the photosensitive diazoquinone compound may be included in an amount ranging from about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the photosensitive diazoquinone compound can be in a range from about any of the foregoing amounts to about any other of the foregoing amounts.

When the photosensitive resin composition includes the photosensitive diazoquinone compound in an amount within the above range, residues may not remain after exposure and film thickness loss during development can be reduced or eliminated, resulting in good pattern formation.

(C) Silane Compound

The silane compound can improve adherence between the photosensitive resin composition and a substrate and between the photosensitive resin composition and an epoxy molding compound disposed on the photosensitive resin composition.

The silane compound may be represented by the following Formula 12.

[Chemical Formula 12]

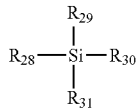

In the above Formula 12:

$R_{28}$ is vinyl, substituted or unsubstituted alkyl, or substituted or unsubstituted aryl, for example 3-(meth)acryloxypropyl, p-styryl, or 3-(phenylamino)propyl; and $R_{29}$ to $R_{31}$ are the same or different and are independently substituted or unsubstituted alkoxy, substituted or unsubstituted alkyl, or halogen, provided that at least one of $R_{29}$ to $R_{31}$ is alkoxy or halogen, for example the alkoxy can be C1 to C8 alkoxy and the alkyl can be C1 to C20 alkyl.

Examples of the silane compound include without limitation: compounds represented by the following Formulae 13 to 14; a silane compound including a carbon-carbon unsaturated bond such as vinyltrimethoxysilane, vinyltriethoxysilane, vinyl trichlorosilane, vinyltris(β-methoxyethoxy)silane, 3-methacryloxypropyltrimethoxysilane, 3-acryloxypropyltrimethoxysilane, p-styryltrimethoxysilane, 3-methacryloxypropylmethyldimethoxysilane, 3-methacryloxypropylmethyl diethoxysilane, trimethoxy[3-(phenylamino)propyl] silane, and the like and combinations thereof. In exemplary embodiments, the silane-based compound can be vinyltrimethoxysilane or vinyltriethoxysilane.

[Chemical Formula 13]

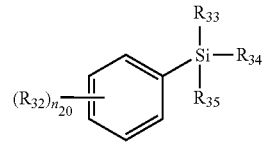

In the above Formula 13:

$R_{32}$ is $NH_2$ or $CH_3CONH$;

$R_{33}$ to $R_{35}$ are the same or different and are independently substituted or unsubstituted alkoxy, for example $OCH_3$ or $OCH_2CH_3$; and $n_{20}$ is an integer of 1 to 5.

[Chemical Formula 14]

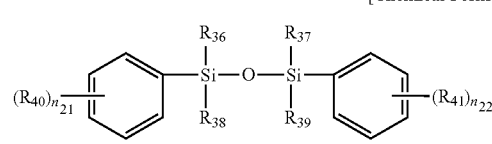

In the above Formula 14:

$R_{36}$ to $R_{39}$ are the same or different and are independently substituted or unsubstituted alkoxy, for example $OCH_3$;

$R_{40}$ and $R_{41}$ are the same or different and are independently substituted or unsubstituted amino, for example $NH_2$ or $CH_3CONH$; and $n_{21}$ and $n_{22}$ are the same or different and are independently integers of 1 to 5.

The photosensitive resin composition includes about 0.1 to about 30 parts by weight of the silane compound, based on about 100 parts by weight of the polybenzoxazole precursor. In some embodiments, the silane compound may be included in an amount ranging from about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the silane compound can be in a range from about any of the foregoing amounts to about any other of the foregoing amounts.

When the amount of the silane compound is less than about 0.1 parts by weight, adherence between lower and upper layers may not be sufficient, whereas when the amount of the silane compound it is more than about 30 parts by weight, residue film may remain after development, and photo characteristics (transmittance), and mechanical properties such as tensile strength, elongation, and Young's modulus, among others, may be reduced.

(D) Polyamic Acid Ester Compound

The polyamic acid ester compound can improve dissolution rates and sensitivity of exposure parts during development using an alkali aqueous solution, and can function as a dissolution controlling agent to enable high resolution patterning without residue (scum) during development.

The polyamic acid ester compound is represented by the following Formula 15.

[Chemical Formula 15]

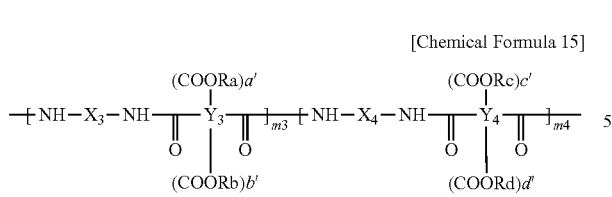

In the above Formula 15:

$X_3$ and $X_4$ are the same or different and are independently an aromatic organic group or a divalent to hexavalent aliphatic organic group, for example a derivative of an aromatic diamine;

$Y_3$ and $Y_4$ are the same or different and are independently an aromatic organic group or a tetravalent to hexavalent aliphatic organic group;

$R_a$, $R_b$, $R_c$, and $R_d$ are the same or different and are independently a univalent organic group;

a', b', c', and d' are the same or different and are independently 0 or 1;

$m_3$ and $m_4$ are respectively mole ratios wherein $m_3+m_4$ is 100 mol %;

$m_3$ ranges from 0 to 100 mol %, for example 20 to 80 mol %; and $m_4$ ranges from 0 to 100 mol %, for example 20 to 80 mol %.

$X_3$ or $X_4$ may be derived from an aromatic diamine such as but not limited to 4,4'-diaminodiphenylether, 4,4'-diaminodiphenylmethane, 4,4'-diaminodiphenylsulfone, 4,4'-diaminodiphenylsulfide, benzidine, m-phenylene diamine, p-phenylene diamine, 1,5-naphthalene diamine, 2,6-naphthalene diamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, and the like m and combinations thereof.

Examples of $X_3$ or $X_4$ include compounds represented by the following Formula 16 to 18, but are not limited thereto.

[Chemical Formula 16]

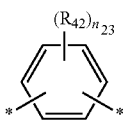

[Chemical Formula 17]

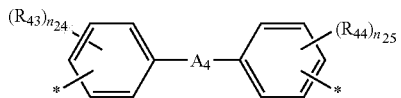

[Chemical Formula 18]

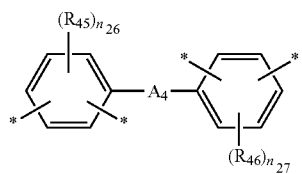

In the above Formulae 16 to 18:

$R_{42}$ to $R_{46}$ are the same or different and are independently hydrogen or substituted or unsubstituted alkyl;

$n_{23}$ is an integer ranging from 1 to 4;

$n_{24}$ to $n_{27}$ are the same or different and are independently integers of 1 to 2;

$A_4$ is O, $CR_{47}R_{48}$, CO, S, or $SO_2$, wherein $R_{47}$ and $R_{48}$ are the same or different and are independently substituted or unsubstituted alkyl, hydrogen, or fluoroalkyl.

$Y_3$ and $Y_4$ are derived from tetracarboxylic acid derivatives. Examples of the tetracarboxylic acid derivatives may be represented by the following Formula 19.

[Chemical Formula 19]

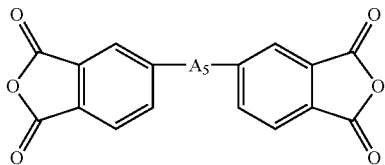

In the above Formula 19, $A_5$ is a single bond, O, CO, or $CR_{49}R_{50}$, but is not limited thereto, wherein $R_{49}$ and $R_{50}$ are the same or different and are independently hydrogen or substituted or unsubstituted alkyl.

$R_a$, $R_b$, $R_c$, and $R_d$ may be any organic groups that are introduced from a reaction of the diamine and tetracarboxylic acid derivative. Examples of the organic groups include without limitation tetrahydropyranyl, ethoxymethyl, and the like.

Since the polyamic acid ester compound is a precursor of polyimide, it is not decomposed or evaporated during a curing process and it is cured into a form of a polyimide compound. Thus, the film shrinkage during curing performed at a high temperature can be significantly lower than that of a conventional photosensitive resin composition. Moreover, since it is non-volatile, it does not have micropores formed on its film surface. Also, since the polyamic acid ester compound is used, the content of polybenzoxazole precursor can be reduced.

The polyamic acid ester compound may have a weight average molecular weight (Mw) ranging from about 3000 to about 30,000. When the polyamic acid ester compound has a weight average molecular weight within this range, the cured polymer can have excellent mechanical properties, such as tensile strength, elongation rate, and modulus of elasticity.

The photosensitive resin composition may include the polyamic acid ester compound in an amount ranging from about 10 to about 100 parts by weight, for example about 40 to about 60 parts by weight, based on about 100 parts by weight of the polybenzoxazole precursor. In some embodiments, the polyamic acid ester compound may be included in an amount ranging from about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the polyamic acid ester compound can be in a range from about any of the foregoing amounts to about any other of the foregoing amounts.

When the amount of polyamic acid ester is less than about 10 parts by weight, the dissolution reduction effect can decrease. Thus, the residual film ratio of a non-exposure part can be reduced and resolution may be reduced. When the amount of polyamic acid ester is more than about 100 parts by weight, the development rate of the exposure part may be so slow that a pattern may be hardly formed.

(E) Solvent

The solvent may include an organic solvent, such as but not limited to N-methyl-2-pyrrolidone, γ-butyrolactone, N,N-dimethyl acetamide, dimethylsulfoxide, diethyleneglycol dimethylether, diethyleneglycol diethylether, diethyleneglycol dibutylether, propyleneglycol monomethylether, dipropyleneglycol monomethylether, propyleneglycol monomethylether acetate, methyl lactate, ethyl lactate, butyl lactate, methyl-1,3-butyleneglycol acetate, 1,3-butyleneglycol-3-monomethylether, methyl pyruvate, ethyl pyruvate, methyl-3-methoxy propionate, and on the like. The solvent may be used singularly or in combination.

The solvent may be included at a weight ratio of about 20:80 to about 90:10 of the solvent and (A) polybenzoxazole precursor. When the photosensitive resin composition includes solvent in an amount within this range, a sufficiently thick film can be obtained and good solubility and coating can be provided.

(F) Other Additives

The photosensitive resin composition may include (F) one or more other additives in addition to the aforementioned (A) to (E) components.

The other additives may include a latent thermal acid generator. Examples of the latent thermal acid generator include without limitation arylsulfonic acid, perfluoroalkyl sulfonic acid, alkylsulfonic acid, and the like, and combinations thereof. Examples of the arylsulfonic acid include without limitation p-toluene sulfonic acid and benzene sulfonic acid, examples of the perfluoroalkyl sulfonic acid include without limitation trifluorinemethane sulfonic acid and fluorobutane sulfonic acid, and examples of the alkyl sulfonic acid include without limitation methane sulfonic acid, ethane sulfonic acid, and butane sulfonic acid. The latent thermal acid generator promotes dehydration reactions of the hydroxyl group-containing polyamide structure of the polybenzoxazole precursor and cyclization, and it can prevent the phenomenon of decreased cyclization at lower curing temperatures.

Other additives include without limitation surfactants and, leveling agents to prevent staining of the film or to improve development.

The additives may be used singularly or in combination.

The process for forming a pattern using a positive photosensitive resin composition includes: coating a positive photosensitive resin composition on a supporting substrate; drying the coated composition to provide a photosensitive polybenzoxazole precursor layer; exposing the polybenzoxazole precursor layer; developing the exposed polybenzoxazole precursor layer in an alkali aqueous solution to provide a photosensitive resin film; and heating the photosensitive resin film. Conditions for coating, drying, exposing, developing, and heating a photosensitive resin composition to provide a pattern are widely known in this art, and accordingly are not illustrated in detail in this specification.

According to another embodiment of the present invention, a semiconductor device including a photosensitive resin film prepared using the photosensitive resin composition is provided. The photosensitive resin composition according to the present invention can be used as an insulation layer, a passivation layer, or a buffer coating layer in a semiconductor device.

Therefore, the photosensitive resin composition may be useful for fabricating a surface protective layer and an interlayer insulating layer of a semiconductor device.

The following examples illustrate the present invention in more detail. However, it is understood that the present invention is not limited by these examples.

SYNTHESIS EXAMPLE 1

Synthesis of Polybenzoxazole Precursor (PBO)

While passing nitrogen through a 4-neck flask with an agitator, a temperature controller, a nitrogen gas injector and a cooler, 18.3 g of 2,2-bis(3-amino-4-hydroxyphenyl)-1,1,1,3,3,3, -hexafluoro propane and 280 g of N-methyl-2-pyrrolidone (NMP) are dissolved therein. The solid content of the acquired solution, which is referred to herein as a first solution, is 9 wt %.

When the solid is completely dissolved, 9.9 g of pyridine is added to the first solution. A second solution is prepared by dissolving 14.8 g of 4,4'-oxydibenzonyl chloride in 142 g of N-methyl-2-pyrrolidone (NMP) and the second solution is dripped slowly into the first solution for 30 minutes while maintaining the temperature at 0 to 5° C. After dripping the second solution into the first solution, the resulting mixture reacts for one hour at a temperature of 0 to 5° C., and then the temperature is increased to room temperature. Subsequently, the solution is agitated for one hour and the reaction ends. The reaction mixture is placed into a third solution prepared by mixing water and methanol at a volume ratio of 10:1 to produce a precipitate. The precipitate is filtered and sufficiently rinsed with water, and dried for more than 24 hours under a vacuum at 80° C. to thereby produce a polybenzoxazole precursor (PBO) having a weight average molecular weight of 11,200, which is shown in the following Formula 20.

[Chemical Formula 20]

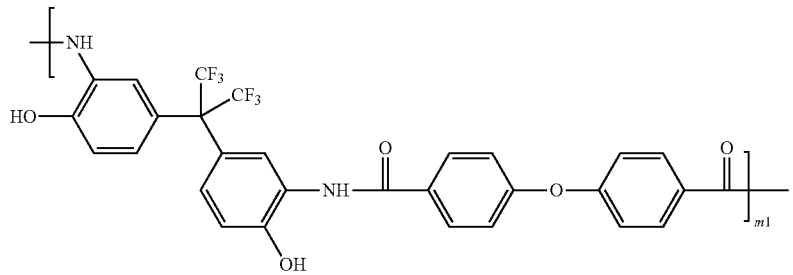

SYNTHESIS EXAMPLE 2

Synthesis of Polyamic Acid Ester Compound (PAE-1)

While passing nitrogen through a 4-neck flask with an agitator, a temperature controller, a nitrogen gas injector, and a cooler, 19.8 g of 4,4'-diaminodiphenylmethane and 178 g of N-methyl-2-pyrrolidone (NMP) are dissolved therein. The solid content of the acquired solution, which is referred to herein as a first solution, is 10 wt %.

When the solid is completely dissolved, a second solution is prepared by dissolving 29.0 g of 3,3',4,4'-benzophenonetetracarboxylic acid dianhydride and 1.96 g of maleic acid anhydride in 278.7 g of N-methyl-2-pyrrolidone (NMP). The second solution is dripped slowly into the first solution for 30 minutes. After the second solution is dripped into the first solution, the resulting mixture reacts for 4 hours at room temperature, and then the temperature is decreased to 0° C. Subsequently, 8.10 g of triethylamine and 7.56 g of chloromethylethylether are added thereto. When a white slurry is acquired after 1 hour, it is filtered and a reaction mixture is acquired. The reaction mixture is placed into a second solution prepared by mixing water and methanol at a volume ratio of 10:1 to thereby produce a precipitate. The precipitate is filtered and sufficiently rinsed with water, and dried for more than 24 hours under a vacuum at 80° C. to thereby produce a polyamic acid ester compound (PAE-1) having a weight average molecular weight of 9800.

SYNTHESIS EXAMPLE 3

Synthesis of Polyamic Acid Ester Compound (PAE-2)

While passing nitrogen through a 4-neck flask with an agitator, a temperature controller, a nitrogen gas injector, and a cooler, 19.8 g of 4,4'-diaminodiphenylmethane and 178 g of N-methyl-2-pyrrolidone (NMP) are dissolved therein. The solid content of the acquired solution, which is referred to herein as a first solution, is 10 wt %.

When the solid is completely dissolved, a second solution is prepared by dissolving 29.0 g of 3,3',4,4'-benzophenonetetracarboxylic acid dianhydride and 1.96 g of maleic acid anhydride in 278.7 g of N-methyl-2-pyrrolidone (NMP). The second solution is dripped slowly into the first solution for 30 minutes. After the second solution is dripped into the first solution, the resulting mixture reacts for 4 hours at room temperature, and then the temperature is decreased to 0° C. Subsequently, 10.12 g of triethylamine and 9.45 g of chloromethylethylether are added thereto. When a white slurry is acquired after 1 hour, it is filtered and a reaction mixture is acquired. The reaction mixture is placed into a second solution prepared by mixing water and methanol at a volume ratio of 10:1 to thereby produce a precipitate. The precipitate is filtered and sufficiently rinsed with water, and dried for more than 24 hours under a vacuum at 80° C. to thereby produce a polyamic acid ester compound (PAE-2) having a weight average molecular weight of 7300.

SYNTHESIS EXAMPLE 4

Synthesis of Polyamic Acid Ester Compound (PAE-3)

While passing nitrogen through a 4-neck flask with an agitator, a temperature controller, a nitrogen gas injector, and a cooler, 19.8 g of 4,4'-diaminodiphenylmethane and 178 g of N-methyl-2-pyrrolidone (NMP) are dissolved therein. The solid content of the acquired solution, which is referred to herein as a first solution, is 10 wt %.

When the solid is completely dissolved, a second solution is prepared by dissolving 29.0 g of 3,3',4,4'-benzophenonetetracarboxylic acid dianhydride and 1.96 g of maleic acid anhydride in 278.7 g of N-methyl-2-pyrrolidone (NMP). The second solution is dripped slowly into the first solution for 30 minutes. After the second solution is dripped into the first solution, the resultant mixture reacts for 4 hours at room temperature, and then the temperature is decreased to 0° C. Subsequently, 11.13 g of triethylamine and 10.40 g of chloromethylethylether are added thereto. When a white slurry is acquired after 1 hour, it is filtered and a reaction mixture is acquired. The reaction mixture is placed into a second solution prepared by mixing water and methanol at a volume ratio of 10:1 to thereby produce a precipitate. The precipitate is filtered and sufficiently rinsed with water, and dried for more than 24 hours under a vacuum at 80° C. to thereby produce a polyamic acid ester compound (PAE-3) having a weight average molecular weight of 8700.

EXAMPLE 1

10 g of the polybenzoxazole precursor (PBO) acquired from Synthesis Example 1 is added to and dissolved in 35.0 g of γ-butyrolactone (GBL). Then, 3 g of photosensitive diazoquinone shown in the following Formula 21, 0.75 g of trimethoxy[3-(phenylamino)propyl]silane shown in the following Formula 22, and 5 g of the polyamic acid ester compound (PAE-1) acquired in Synthesis Example 2 are added thereto and dissolved therein. Subsequently, the mixture solution is filtered by a 0.45-μm fluorine resin filter to thereby produce a positive photosensitive polybenzoxazole precursor composition.

[Chemical Formula 21]

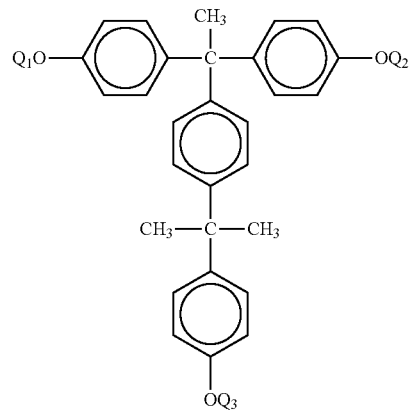

In the above formula, two of $Q_1$, $Q_2$, and $Q_3$ are substituted with the following Chemical Formula 21-1, and the remaining one is hydrogen.

[Chemical Formula 21-1]

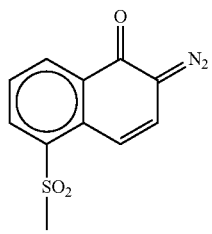

[Chemical Formula 22]

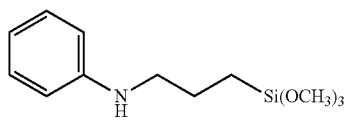

EXAMPLE 2

A positive photosensitive polybenzoxazole precursor composition is prepared using the same process as Example 1, except that the polyamic acid ester compound (PAE-2) acquired in Synthesis Example 3 is used instead of the polyamic acid ester compound (PAE-1) acquired in Synthesis Example 2.

EXAMPLE 3

A positive photosensitive polybenzoxazole precursor composition is prepared using the same process as Example 1, except that the polyamic acid ester compound (PAE-3) acquired in Synthesis Example 4 is used instead of the polyamic acid ester compound (PAE-1) acquired in Synthesis Example 2.

EXAMPLE 4

10.6 g of the polybenzoxazole precursor (PBO) acquired from Synthesis Example 1 is added to and dissolved in 35.0 g of γ-butyrolactone (GBL). Then, 3 g of photosensitive diazoquinone shown in Formula 21, 0.75 g of trimethoxy[3-(phenylamino)propyl]silane shown in Formula 22, and 4.4 g of the polyamic acid ester compound (PAE-1) acquired in Synthesis Example 2 are added thereto and dissolved therein. Subsequently, the mixture solution is filtered by a 0.45-μm fluorine resin filter to thereby produce a positive photosensitive polybenzoxazole precursor composition.

EXAMPLE 5

A positive photosensitive polybenzoxazole precursor composition is prepared using the same process as Example 1, except that the polyamic acid ester compound (PAE-2) acquired in Synthesis Example 3 is used instead of the polyamic acid ester compound (PAE-1) acquired in Synthesis Example 2.

EXAMPLE 6

A positive photosensitive polybenzoxazole precursor composition is prepared using the same process as Example 4, except that the polyamic acid ester compound (PAE-3) acquired in Synthesis Example 4 is used instead of the polyamic acid ester compound (PAE-1) acquired in Synthesis Example 2.

COMPARATIVE EXAMPLE 1

15 g of the polybenzoxazole precursor (PBO) acquired from Synthesis Example 1 is added to and dissolved in 35.0 g of γ-butyrolactone (GBL). Then, 3 g of photosensitive diazoquinone shown in Formula 21, 0.75 g of trimethoxy[3-(phenylamino)propyl]silane shown in Formula 22, and 0.75 g of 4,4'-ethyldine bisphenol shown in the following Formula 23 as a phenol compound are added thereto and dissolved therein. Subsequently, the mixture solution is filtered by a 0.45-μm fluorine resin filter to thereby produce a positive photosensitive polybenzoxazole precursor composition.

[Chemical Formula 23]

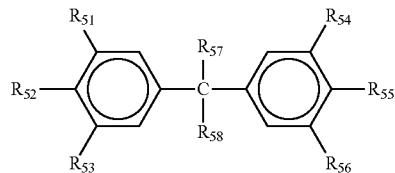

In the above formula, $R_{51}$, $R_{53}$, $R_{54}$, and $R_{56}$ are hydrogen, $R_{52}$ and $R_{55}$ are hydroxy (OH), $R_{57}$ is $CH_3$, and $R_{58}$ is hydrogen.

COMPARATIVE EXAMPLE 2

15 g of the polybenzoxazole precursor (PBO) acquired from Synthesis Example 1 is added to and dissolved in 35.0 g of γ-butyrolactone (GBL). Then, 3 g of photosensitive diazoquinone shown in Formula 21, 0.75 g of trimethoxy[3-(phenylamino)propyl]silane shown in Formula 22, and 0.75 g of 2,2-bis(4-hydroxyphenyl)propane as a phenol compound are added thereto and dissolved therein. Subsequently, the mixture solution is filtered by a 0.45-μm fluorine resin filter to thereby produce a positive photosensitive polybenzoxazole precursor composition.

Measuring Physical Properties

Each of the photosensitive polybenzoxazole precursor compositions according to Examples 1 to 6 and Comparative Examples 1 and 2 is coated on an 8-inch wafer by a spin coater manufactured by Mikasa (1H-DX2), and then heated on a hot plate to 120° C. for 4 minutes to provide a photosensitive polyimide precursor film.

The polyimide precursor film is exposed through a mask having various patterns by an I-line stepper (NSR i10C) manufactured by Nikon Japan for 250 ms, dissolved in a 2.38% tetramethyl ammonium hydroxide aqueous solution at room temperature for 60 seconds (2 puddles) to remove the exposed part, and washed with pure water for 30 seconds. Then, the obtained patterns are cured in an electrical furnace under an oxygen concentration of 1000 ppm or less at 150° C. for 30 minutes and at 320° C. for 30 minutes to provide patterned films.

Resolution, film thickness changes, residual film ratio, sensitivity, and resolution of the patterned films are measured. The results are shown in the following Table 1.

The resolution of the obtained film pattern is observed through an optical microscope, and the film thicknesses after pre-baking, development, and curing is measured by equipment manufactured by ST4000-DLX (K-MAC, Korea Materials & Analysis Corp).

With regard to the decrease of the film thickness affected by the development, and the resulting film thickness, film thickness should not significantly decrease during the development. In order to measure this, the pre-baked film is immersed in 2.38% tetramethyl ammonium hydroxide (TMAH) aqueous solution for different times and washed with water. The change in film thickness is measured by calculating the residual film ratio (thickness after development/thickness before development, unit: %).

In order to measure the sensitivity, the optimal exposure time is determined when a 10 μm LIS (line and space) pattern is formed in a line width of 1 to 1, and the resolution is determined as the minimum pattern size at the optimal exposure time.

The shrinkage ratio is the percentage difference between the film thickness before baking and the film thickness after baking. The film thickness is measured by equipment manufactured by ST4000-DLX (K-MAC, Korea Materials & Analysis Corp).

After patterning, the patterned films are heated at 120° C. for 30 minutes, and then heated at 320° C. for 1 hour after increasing the temperature to 320° C. for 1 hour to obtain a cured film.

TABLE 1

| | Resolution (μm) | Film thickness (μm) | | | Residual film ratio (%) | Sensitivity (mJ/cm$^2$) | Shrinkage ratio (%) |
| --- | --- | --- | --- | --- | --- | --- | --- |
| | | After pre-baking | After development | After curing | | | |
| Ex. 1 | 7 | 6.7 | 6.37 | 5.86 | 95 | 390 | 8 |
| Ex. 2 | 7 | 6.5 | 5.98 | 5.56 | 92 | 390 | 7 |
| Ex. 3 | 3 | 6.5 | 5.92 | 5.62 | 91 | 370 | 5 |
| Ex. 4 | 7 | 6.6 | 6.34 | 5.64 | 96 | 370 | 11 |
| Ex. 5 | 5 | 6.4 | 6.02 | 5.48 | 94 | 370 | 9 |
| Ex. 6 | 3 | 6.5 | 6.05 | 5.57 | 93 | 360 | 8 |
| Comp. Ex. 1 | 5 | 8.1 | 5.75 | 4.83 | 71 | 410 | 16 |
| Comp. Ex. 2 | 7 | 7.7 | 4.16 | 3.58 | 54 | 390 | 14 |

Table 1 shows that the photosensitive resin compositions of the Examples 1 to 6 have a greater residual film ratio than those of Comparative Examples 1 and 2 according to time. Therefore, the photosensitive resin compositions of the Examples 1 to 6 form patterns when development is carried out with an alkali aqueous solution.

Also, after pre-baking, the photosensitive resin compositions of the Examples 1 to 6 show little change in film thickness after development and after curing, which indicates that the film shrinkage is remarkably low. In addition, although the photosensitive resin compositions of the Examples 1 to 6 show less change in film thickness after pre-baking than those of Comparative Examples 1 and 2, rather thick films are acquired through the development and thermocuring. Therefore, it is expected that the photosensitive resin composition of the present invention can decrease the content of polymer and this will be advantageous commercially.

Furthermore, since the photosensitive resin compositions of Example 1 to 6 are superior to or equal to those of Comparative Example 1 and 2 with regard to sensitivity and resolution as well, the use of the photosensitive resin compositions of Example 1 to 6 can effectively form patterns while improving the sensitivity and resolution.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

That which is claimed is:

1. A positive photosensitive resin composition comprising:
(A) a polybenzoxazole precursor including a repeating unit represented by the following Formula 1;
(B) a photosensitive diazoquinone compound;
(C) a silane compound;
(D) a polyamic acid ester compound; and
(E) a solvent,

[Chemical Formula 1]

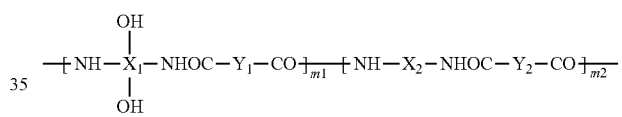

wherein in the above Formula 1:

$X_1$ is an aromatic organic group, a tetravalent to hexavalent aliphatic organic group, an alicyclic organic group including a hetero atom, or a tetravalent to hexavalent aliphatic organic group including a hetero atom;

$X_2$ is an aromatic organic group, a divalent to hexavalent aliphatic organic group, an alicyclic organic group including a hetero atom, a divalent to hexavalent aliphatic organic group including a hetero atom, or a group represented by the following Formula 2;

$Y_1$ and $Y_2$ are the same or different and are independently an aromatic organic group, a divalent to hexavalent aliphatic organic group, an alicyclic organic group including a hetero atom, or a divalent to hexavalent aliphatic organic group including a hetero atom;

m1 and m2 are respectively mole ratios, where m1+m2 is 100 mol %;

m1 ranges from 60 to 100 mol %; and m2 ranges from 0 to 40 mol %,

[Chemical Formula 2]

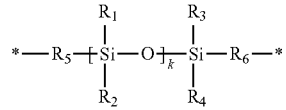

wherein, in the above Formula 2:

$R_1$ to $R_4$ are the same or different and are independently substituted or unsubstituted alkyl, substituted or unsubstituted aryl, substituted or unsubstituted alkoxy, or hydroxy;

$R_5$ and $R_6$ are the same or different and are independently substituted or unsubstituted alkylene or substituted or unsubstituted arylene; and k is an integer ranging from 1 to 50.

2. The positive photosensitive resin composition of claim 1, wherein the polybenzoxazole precursor has a weight average molecular weight (Mw) of about 3000 to about 300,000.

3. The positive photosensitive resin composition of claim 1, wherein the polyamic acid ester compound is represented by the following Formula 15,

[Chemical Formula 15]

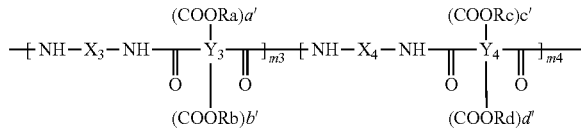

wherein, in the above Formula 15:

$X_3$ and $X_4$ are the same or different and are independently an aromatic organic group or a divalent to hexavalent aliphatic organic group;

$Y_3$ and $Y_4$ are the same or different and are independently an aromatic organic group or a tetravalent to hexavalent aliphatic organic group;

Ra, Rb, Rc, and Rd are the same or different and are independently a univalent organic group;

a', b', c', and d' are the same or different and are independently 0 or 1;

m3 and m4 are respectively mole ratios, where m3+m4 is 100 mol %;

m3 ranges from 0 to 100 mol %; and m4 ranges from 0 to 100 mol %.

4. The positive photosensitive resin composition of claim 3, wherein the polyamic acid ester compound has a weight average molecular weight (Mw) of about 3000 to about 30,000.

5. The positive photosensitive resin composition of claim 1, wherein the solvent comprises N-methyl-2-pyrrolidone, y-butyrolactone, N,N-dimethyl acetamide, dimethylsulfoxide, diethyleneglycol dimethylether, diethyleneglycol diethylether, diethyleneglycol dibutylether, propyleneglycol monomethylether, dipropyleneglycol monomethylether, propyleneglycol monomethylether acetate, methyl lactate, ethyl lactate, butyl lactate, methyl-1,3-butyleneglycol acetate, 1,3-butyleneglycol-3-monomethylether, methyl pyruvate, ethyl pyruvate, methyl-3-methoxy propionate, or a combination thereof.

6. The positive photosensitive resin composition of claim 1, wherein the photosensitive resin composition comprises, based on about 100 parts by weight of (A) the polybenzoxazole precursor:

(B) about 5 to about 100 parts by weight of a photosensitive diazoquinone compound;

(C) about 0.1 to about 30 parts by weight of a silane compound;

(D) about 10 to about 100 parts by weight of a polyamic acid ester compound; and (E) a solvent, wherein the solvent and polybenzoxazole precursor are included at a weight ratio of about 20 : 80 to about 90 : 10.

7. A photosensitive resin film fabricated using the positive photosensitive resin composition according to claim 1.

8. A semiconductor device comprising the photosensitive resin film according to claim 7.

* * * * *

UNITED STATES PATENT AND TRADEMARK OFFICE
CERTIFICATE OF CORRECTION

PATENT NO. : 8,703,367 B2
APPLICATION NO. : 13/073005
DATED : April 22, 2014
INVENTOR(S) : Hyun-Yong Cho et al.

It is certified that error appears in the above-identified patent and that said Letters Patent is hereby corrected as shown below:

In the Specification

Column 11, line 55, Chemical Formula 18 is depicted as:

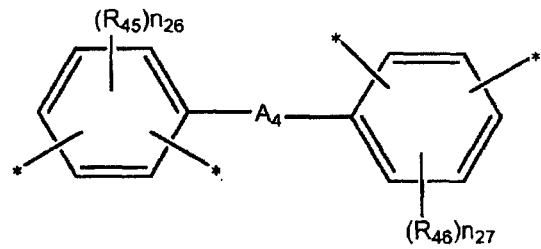

and should be depicted as:

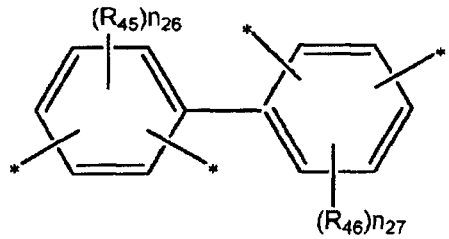

Column 18, line 64 reads: "time is determined when a 10μm L̶I̶S̶ (line and space) pattern"
and should read: "time is determined when a 10μm L/S (line and space) pattern"

Signed and Sealed this
Ninth Day of September, 2014

Michelle K. Lee
*Deputy Director of the United States Patent and Trademark Office*